United States Patent
Katayama et al.

(10) Patent No.: US 9,336,882 B2
(45) Date of Patent: May 10, 2016

(54) SEMICONDUCTOR STORAGE DEVICE AND DRIVING METHOD THEREOF

(71) Applicant: Kabushiki Kaisha Toshiba, Minato-ku (JP)

(72) Inventors: Akira Katayama, Yamato (JP); Katsuhiko Hoya, Yokohama (JP); Keiichi Ryu, Kamakura (JP); Yasuharu Takagi, Chuo-ku (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/281,433

(22) Filed: May 19, 2014

(65) Prior Publication Data

US 2014/0254254 A1    Sep. 11, 2014

Related U.S. Application Data

(63) Continuation of application No. PCT/JP2012/070780, filed on Aug. 9, 2012.

(30) Foreign Application Priority Data

Nov. 21, 2011 (JP) .................... 2011-253915

(51) Int. Cl.
*G11C 5/14* (2006.01)
*G11C 14/00* (2006.01)
*G11C 11/16* (2006.01)

(52) U.S. Cl.
CPC ............ *G11C 14/0036* (2013.01); *G11C 5/147* (2013.01); *G11C 11/16* (2013.01)

(58) Field of Classification Search
CPC ...... G11C 14/0036; G11C 11/16; G11C 5/147
USPC .......................................... 365/226, 227, 229
See application file for complete search history.

(56) References Cited

U.S. PATENT DOCUMENTS 5,365,487 A    11/1994  Patel et al.
5,634,106 A     5/1997  Yaezawa et al.

(Continued)

FOREIGN PATENT DOCUMENTS

JP    2010-198127 A    9/2010

OTHER PUBLICATIONS

Combined Taiwanese Office Action and Search Report issued Feb. 13, 2015 in Patent Application No. 101131605 (with English translation).

(Continued)

*Primary Examiner* — Viet Q Nguyen
(74) *Attorney, Agent, or Firm* — Oblon, McClelland, Maier & Neustadt, L.L.P.

(57) ABSTRACT

A memory includes a cell array including nonvolatile memory cells. A power generator generates a power supply voltage for driving the cell array. A receiver receives a command and an address. A controller controls an active state of the cell array, the power generator, and the receiver. In an activation mode, the cell array, the power generator, and the receiver are turned into the active states. In a first power saving mode, the cell array, the power generator, and the receiver are turned into inactive states. In a second power saving mode, the cell array and the power generator are turned into the active states, and the receiver is turned into the inactive state. In a third power saving mode, at least a part of the power generator is turned into the active state, and the cell array and the receiver are turned into the inactive states.

19 Claims, 7 Drawing Sheets

(56) References Cited

U.S. PATENT DOCUMENTS

| | | | |
|---|---|---|---|
| 5,893,135 A | 4/1999 | Hasbun et al. | |
| 5,999,457 A | 12/1999 | Sato | |
| 6,260,149 B1 * | 7/2001 | Baweja | G06F 1/3203 713/300 |
| 6,301,184 B1 * | 10/2001 | Sasaki | G11C 7/1045 365/226 |
| 6,426,908 B1 * | 7/2002 | Hidaka | G11C 5/14 365/222 |
| 6,515,928 B2 | 2/2003 | Sato et al. | |
| 6,781,909 B2 * | 8/2004 | Kurita | G11C 11/406 365/222 |
| 6,922,369 B2 * | 7/2005 | Kim | G11C 11/406 365/222 |
| 6,934,210 B2 * | 8/2005 | Akiba | G11C 5/147 365/211 |
| 6,947,347 B2 * | 9/2005 | Fujioka | G06F 1/3203 365/149 |
| 6,996,023 B2 * | 2/2006 | Kim | G11C 5/14 365/226 |
| 7,064,998 B2 * | 6/2006 | Nakamura | G11C 7/22 365/189.08 |
| 7,173,870 B2 * | 2/2007 | Lee | G11C 11/406 365/222 |
| 7,768,858 B2 | 8/2010 | Lee | |
| 7,907,464 B2 * | 3/2011 | Oh | G11C 7/04 365/189.05 |
| 8,127,162 B2 * | 2/2012 | Satoh | G06F 1/3287 713/322 |
| 8,190,788 B2 * | 5/2012 | Mochizuki | G06F 11/1441 710/14 |
| 2008/0002485 A1 * | 1/2008 | Kim | G11C 7/1051 365/198 |
| 2010/0235714 A1 | 9/2010 | Toda | |

OTHER PUBLICATIONS

International Search Report mailed Sep. 18, 2012 for PCT/JP2012/070780 filed on Aug. 9, 2012 (in English).

JEDEC Standard Low Power Double Data Rate 2 (LPDDR2) JESD209-2A (Revision of JESD209-2, Mar. 2009), JEDEC Solid State Technology Association.

Office Action issued Jan. 6, 2015 in Japanese Patent Application No. 2011-253915 (with English language translation).

JEDEC Standard Low Power Double Data Rate 2 (LPDDR2) JESD209-2B (Revision of JESD209-2A, Oct. 2009), Feb. 2010, JEDEC Solid State Technology Association.

Office Action mailed Dec. 3, 2015 in Chinese Application No. 201280056384.8 (w/English translation).

* cited by examiner

|  | Recovery Time | Power Consumption | RCA (Command & Address Receiver) | PG (Power generator) | MCA (Memory Cell Array) |
|---|---|---|---|---|---|
| DPD | Tdpd | Idpd | Off | Off | Off |
| MID1 | Tmid1 | Imid1 | Off | On | Off |
| PD | Tpd | Ipd | Off | On | On |
| Idle | Tidle | Iidle | On | On | On |

FIG.5

|  | Recovery Time | Power Consumption | RCA (Command & Address Receiver) | PG (Power generator) | MCA (Memory Cell Array) |
|---|---|---|---|---|---|
| DPD | Tdpd | Idpd | Off | Off | Off |
| MID2 | Tmid2 | Imid2 | Off | △ (GVpp,GVbb,BGR,GVref) | Off |
| PD | Tpd | Ipd | Off | On | On |
| Idle | Tidle | Iidle | On | On | On |

FIG.8

SEMICONDUCTOR STORAGE DEVICE AND DRIVING METHOD THEREOF

CROSS REFERENCE TO RELATED APPLICATIONS

This application is based upon and claims the benefit of priority from the prior Japanese Patent Application No. 2011-253915, filed on Nov. 21, 2011, the entire contents of which are incorporated herein by reference.

FIELD

The embodiments relate to a semiconductor storage device and driving method thereof.

BACKGROUND

Nonvolatile memories such as an MRAM (Magnetic Random Access Memory) have been developed as replacements for volatile memories such as a DRAM (Dynamic RAM).

PRIOR ART

Non-Patent Document 1: JEDEC STANDARD "Low Power Double Data Rate 2 (LPDDR2) JESD209-2A" (Revision of JESD209-2, March 2009) JEDEC SOLID STATE TECHNOLOGY ASSOCIATION

BRIEF DESCRIPTION OF THE DRAWINGS

FIG. 5 is a table showing an active state or an inactive state of each of the command/address receiver RCA, the power generator PG, and the memory cell array MCA in each state of the first embodiment;

FIG. 8 is a table showing an active state or an inactive state of each of the command/address receiver RCA, the power generator PG, and the memory cell array MCA in each state of the second embodiment.

DETAILED DESCRIPTION

A semiconductor storage device according to the present embodiment includes a memory cell array including a plurality of nonvolatile memory cells. A power generator generates a power supply voltage for driving the memory cell array. A first receiver receives a command and an address for controlling the memory cell array. A controller controls an active state of each of the memory cell array, the power generator, and the first receiver according to the command and the address. In an activation mode, the memory cell array, the power generator, and the first receiver are turned into the active states. In a first power saving mode, the memory cell array, the power generator, and the first receiver are turned into inactive states. In a second power saving mode, the memory cell array and the power generator are turned into the active states, and the first receiver is turned into the inactive state. In a third power saving mode, at least a part of the power generator is turned into the active state, and the memory cell array and the first receiver are turned into the inactive states.

Embodiments will now be explained with reference to the accompanying drawings. The present invention is not limited to the embodiments.

First Embodiment

Figure 1:
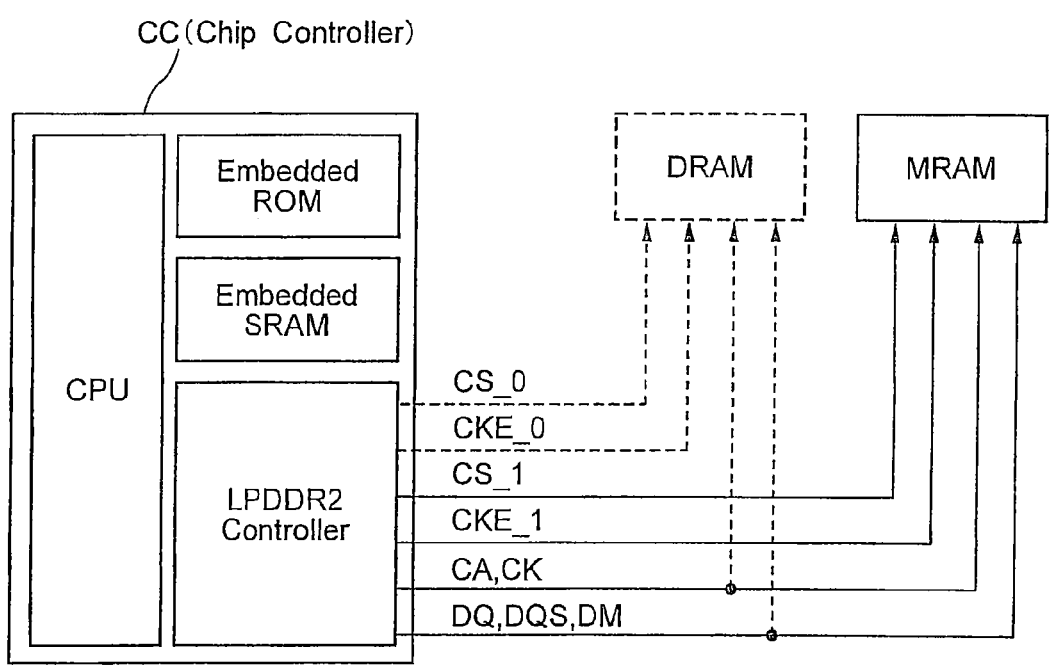
FIG. 1 is a block diagram showing an MRAM and a chip controller CC according to a first embodiment.

FIG. 1 is a block diagram showing an MRAM and a chip controller CC according to a first embodiment. The first embodiment is applicable to a nonvolatile memory such as a PRAM or a ReRAM instead of the MRAM.

The chip controller CC includes a CPU, a ROM, an SRAM, and an LPDDR2 (Lower-Power Double Data Rate 2) controller. The LPDDR2 controller outputs a chip select signal CS_1, a clock enable signal CKE_1, a command signal CA (including an address signal), a clock signal CK, data DQ, a strobe signal DQS, and mask data DM to the MRAM. The LPDDR2 controller controls the MRAM according to these signals.

Generally, the LPDDR2 standard in the JEDEC (Joint Electron Device Engineering Council) is applied to a volatile memory such as a DRAM. The command signal CA includes a refresh signal and a self refresh signal. Therefore, as shown in FIG. 1, a mixture of the MRAM that is a nonvolatile memory and the DRAM that is a volatile memory requiring a refresh operation can be mounted on the same substrate.

Figure 2:
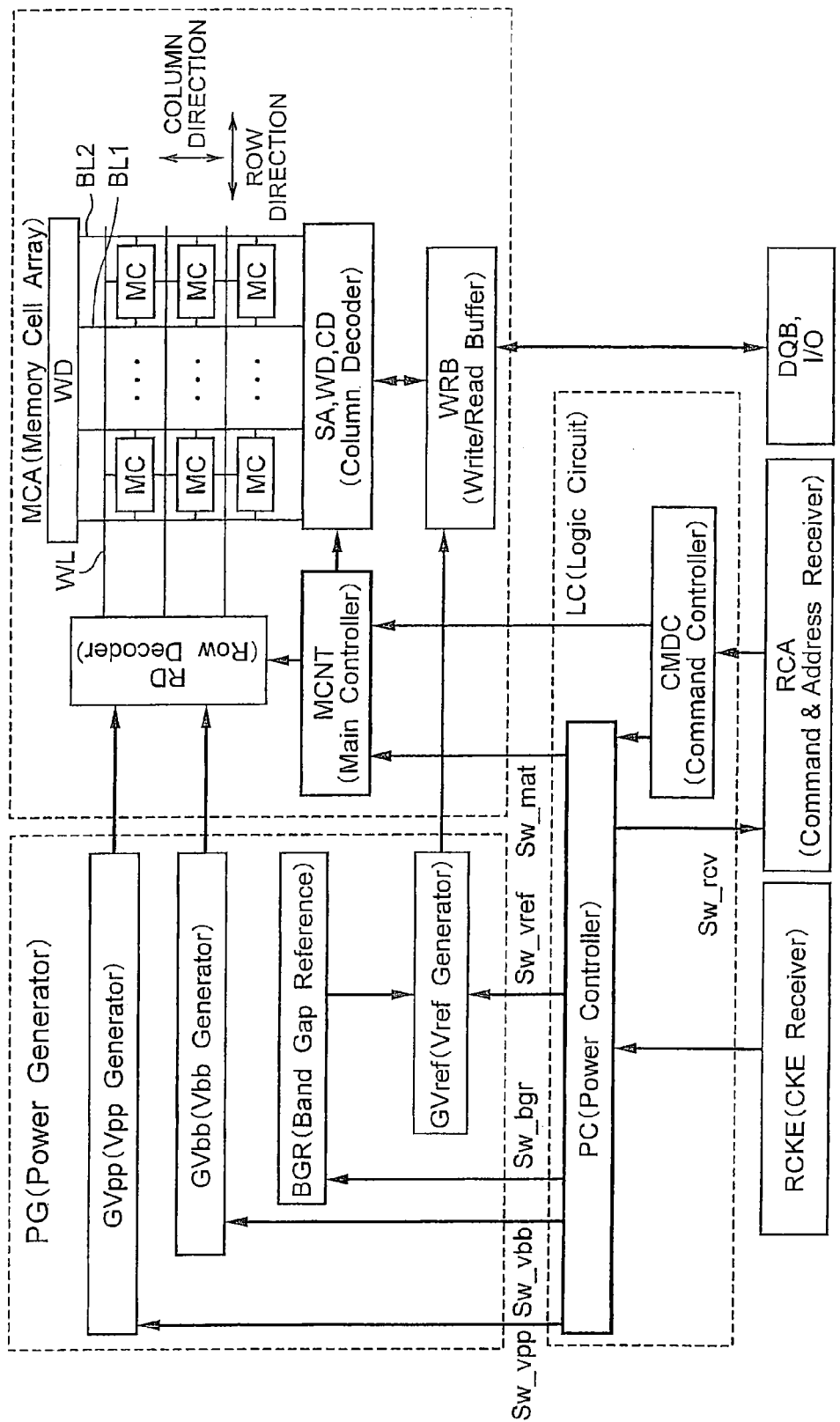
FIG. 2 is a block diagram showing a configuration of the MRAM according to the first embodiment.

FIG. 2 is a block diagram showing a configuration of the MRAM according to the first embodiment. The MRAM according to the first embodiment includes a memory cell array MCA, a power generator PG, a logic circuit LC, a clock enable receiver RCKE, a command/address receiver RCA, a data buffer DQB, and an input/output unit I/O.

The memory cell array MCA includes a plurality of memory cells MC arranged, for example, two-dimensionally in a matrix. Each memory cell MC is connected to paired bit lines (for example, bit lines BL1 and BL2 as shown in FIG. 2) and to one word line WL. That is, one end of the memory cell MC is connected to one bit line BL1 of the paired bit lines, and the other end thereof is connected to the other bit line BL2 of the paired bit lines. The paired bit lines BL1 and BL2 extend in a column direction. The word lines WL extend in a row direction orthogonal to the column direction.

The memory cell array MCA also includes sense amplifiers SA, a write driver WD, a column decoder CD, a row decoder RD, a main controller MCNT, and a write/read buffer WRB.

Each sense amplifier SA is connected to the memory cells MC via, for example, the bit line BL1 and functions to detect data stored in the memory cells MC. The bit line BL2 is connected to a reference voltage (ground). The write drivers WD are connected to the memory cells MC via, for example, the paired bit lines BL1, BL2 and functions to write data to the memory cells MC.

The main controller MCNT transfers data received from the data buffer DQB to the write driver WD so as to write the data to the memory cells MC in a desired column under control of the chip controller CC. In addition, the main controller MCNT transfers data read from the memory cells MC in the desired column to the data buffer DQB under control of the chip controller CC.

The column decoder CD selects one pair of bit lines in a certain column according to a column address transmitted from the command/address receiver RCA.

The row decoder RD selects one word line WL according to a row address transmitted from the command/address receiver RCA.

The write/read buffer WRB temporarily stores therein write data input via the input/output unit I/O and the data buffer DQB or temporarily stores therein read data from the memory cells MC.

The data buffer DQB temporarily holds the read data so as to output the read data to outside via the input/output unit I/O, or temporarily holds the write data captured from outside via the input/output unit I/O so as to transfer the write data to inside of the MRAM.

The clock enable receiver RCKE receives the clock enable signal CKE determining whether the MRAM can receive the clock signal CK, and effectively passes through the clock signal CK when the clock enable signal CKE is activated.

The power generator PG generates a power supply voltage for driving the memory cell array MCA. The power generator PG includes a Vpp generator GVpp, a Vbb generator GVbb, a band gap reference BGR, and a Vref generator GVref. The Vpp generator GVpp serving as a first booster boosts an external power supply voltage toward a positive side, that is, to a high-level voltage Vpp. The Vbb generator GVbb serving as a second booster boosts the external power supply voltage toward a negative side, that is, to a low-level voltage Vbb. The band gap reference BGR serving as a constant-voltage generator generates a first voltage Vbgr which is substantially constant. The Vref generator GVref serving as a reference-voltage generator generates a second voltage (reference voltage) Vref used to apply a current to the memory cells MC based on the first voltage Vbgr transmitted from the band gap reference BGR.

The high-level voltage Vpp generated by the Vpp generator GVpp is applied, for example, to a selected word line WL via the row decoder RD. During a data writing or data reading operation, the current driving capability of a cell transistor of a selected memory cell MC can be thereby improved. The high-level voltage Vpp is also used when the write driver WD applies a cell current Icell to the memory cells MC.

The low-level voltage Vbb generated by the Vbb generator GVbb is applied, for example, to unselected word lines WL via the row decoder RD. This can reduce an off-leakage current flowing to a cell transistor CT of each of the unselected memory cells MC.

The first voltage Vbgr generated by the band gap reference BGR is an original voltage for generating the second voltage Vref, for example.

The second voltage Vref generated by the Vref generator GVref is used, for example, to apply the cell current Icell to the selected memory cell MC via the paired bit lines BL during the data reading operation. At this time, each sense amplifier SA detects a logical level of the data stored in the selected memory cell MC according to the cell current Icell applied to the selected memory cell MC.

The logic circuit LC includes a power controller PC and a command controller CMDC. The power controller PC controls the power generator PG, the main controller MCNT, and the command/address receiver RCA. For example, the power controller PC controls switching of booster circuits included in the Vpp generator GVpp, the Vbb generator GVbb, the band gap reference BGR, and the Vref generator GVref so that the Vpp generator GVpp, the Vbb generator GVbb, the band gap reference BGR, and the Vref generator GVref can generate the voltage levels Vpp, Vbb, Vbgr, and Vref, respectively. The power controller PC also controls respectively driving switches of the main controller MCNT and the command/address receiver RCA. The power controller PC can thereby selectively turn the power generator PG, the main controller MCNT, and the command/address receiver RCA into active states (ON states) or inactive states (OFF states).

The command controller CMDC receives commands indicating various operations such as the data reading operation and the data writing operation, and controls the main controller MCNT according to each command.

The command/address receiver RCA serving as a first receiver receives commands and addresses for determining operations to be performed by the memory cell array MCA. The command/address receiver RCA receives a column address, a row address, and the like as the addresses. The command/address receiver RCA receives, as the commands, an active command ACR, a refresh command REF, a self refresh command SREF, a power down command PD, a deep power down command DPD, an MR (Mode Register) writing command MRW, an MR reading command MRR, a reset command RST, and the like. The memory cell array MCA can perform various operations according to the respective commands, which are described later.

These commands can be distinguished based on a combination of logical levels of signals such as a clock enable signal CKE_1 and/or a chip select signal CS_1.

The command/address receiver RCA outputs the received commands to the command controller CMDC under control of the power controller PC. Furthermore, the command/address receiver RCA outputs the received addresses to the row decoder RD and the column decoder CD.

Figure 3:
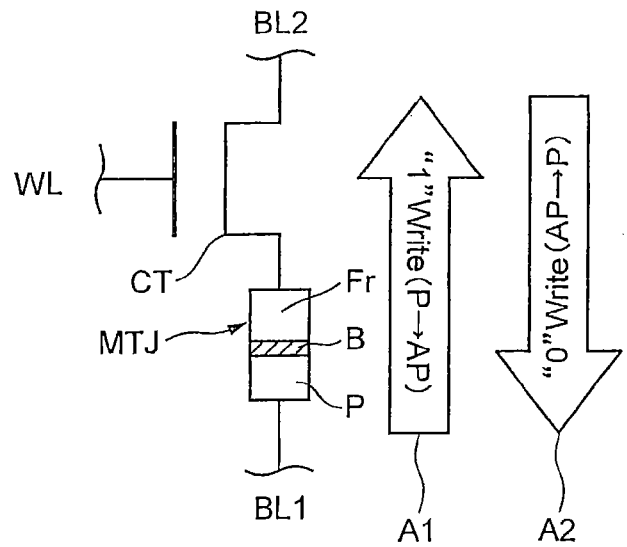
FIG. 3 is an explanatory diagram showing a configuration of a single memory cell MC.

FIG. 3 is an explanatory diagram showing a configuration of a single memory cell MC. Each memory cell MC includes an MTJ (Magnetic Tunnel Junction) element and the cell transistor CT. The MTJ element and the cell transistor CT are connected in series between the bit lines BL1 and BL2. In the memory cell MC, the cell transistor CT is located near the bit line BL2 and the MTJ element is located near the bit line BL1. A gate of the cell transistor CT is connected to one word line WL.

The STT (Spin Transfer Torque)-MTJ element that uses the TMR (tunneling magnetoresistive) effect has a stacked structure in which a nonmagnetic layer (an insulating film) is sandwiched between two ferromagnetic layers. The MTJ element stores therein digital data by a change in a magnetic resistance due to spin-polarized tunneling. The MTJ element can be set in a low resistance state or a high resistance state depending on magnetization orientations of the two ferromagnetic layers. For example, when it is defined that the low resistance state indicates data "0" and that the high resistance state indicates data "1", one-bit data can be recorded in the MTJ element. Needless to say, it can be defined that the low resistance state indicates data "1" and that the high resistance state indicates data "0". As shown in FIG. 3, the MTJ element is configured by sequentially stacking a pinned layer P, a tunnel barrier layer B, and a recording layer Fr in this order, for example. The pinned layer P and the recording layer Fr are made of ferromagnetic bodies and the tunnel barrier layer B is an insulating film. The pinned layer P has a fixed magnetization orientation, and the recording layer Fr has a variable magnetization orientation. The MTJ element stores data therein depending on the magnetization orientation of the recording layer Fr.

When a current equal to or higher than an inversion threshold current flows in an arrow A1 direction at the time of the data writing operation, the magnetization orientation of the recording layer Fr is anti-parallel to that of the pinned layer P, whereby the MTJ element turns into the high resistance state (data "1"). When a current equal to or higher than the inversion threshold current flows in an arrow A2 direction at the time of the data writing operation, the magnetization orientation of the recording layer Fr is parallel to that of the pinned layer P, whereby the MTJ element turns into the low resistance state (data "0"). In this way, different data can be written to the MTJ element depending on a current flow direction.

Figure 4:
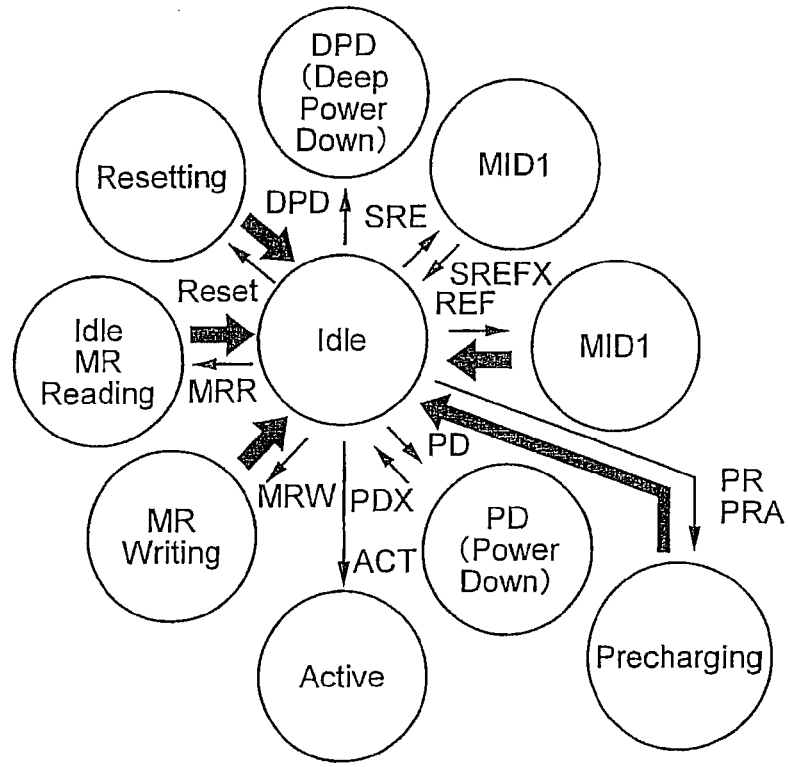
FIG. 4 shows state transitions from an idle state to various states.

FIG. 4 is a state diagram of the MRAM according to the first embodiment. FIG. 5 is a table showing an active state (an ON state) or an inactive state (an OFF state) of each of the command/address receiver RCA, the power generator PG, and the memory cell array MCA in each state of the first embodiment.

FIG. 4 shows state transitions from an idle state to various states. In the idle state that is an activation mode, the command/address receiver RCA, the power generator PG, and the memory cell array MCA are all in the active states (ON states) as shown in FIG. 5. Accordingly, the command/address receiver RCA is in a state where the command/address receiver RCA can receive the command and addresses. The MRAM can thereby transition to an active state or one of the various other states in a short time.

Normally, however, a memory consumes relatively high power in the idle state. Therefore, the volatile memory such as the DRAM requiring a refresh operation transitions from the active state to a reduced power state for saving power consumption, when the memory is not used. Externally input commands control these state transitions.

The semiconductor storage device according to the first embodiment includes, as power saving modes, a first power saving mode, a second power saving mode, and a third power saving mode. The first, second, and third power saving modes are now described in detail.

In a deep power down state (hereinafter, also "DPD state") that corresponds to the first power saving mode, the power controller PC turns all of the memory cell array MCA, the power generator PG, and the command/address receiver RCA into in inactive states (see FIG. 5). In the DPD state in which the memory cell array MCA, the power generator PG, and the command/address receiver RCA are turned into the inactive states, power consumption Pdpd is quite low while a recovery time Tdpd to the idle state is relatively long.

In a power down state (hereinafter, also "PD state") that corresponds to the second power saving mode, the power controller PC turns the memory cell array MCA and the power generator PG into active states and turns the command/address receiver RCA into the inactive state. In the PD state in which the memory cell array MCA and the power generator PG are turned into the active states, a recovery Tpd to the idle state is relatively short but power consumption Ppd is somewhat high. For example, the power consumption Ppd is higher than the power consumption Pdpd.

In a first intermediate state (hereinafter, also "MID1 state") that corresponds to the third power saving mode, the power controller PC turns the power generator PG into the active state and turns the memory cell array MCA and the command/address receiver RCA into the inactive states.

The inactive state of the memory cell array MCA is a state in which at least a part of elements (e.g. memory cells MC, row decoder RD, sense amplifier SA, column decoder CD etc. in FIG. 2) included in the memory cell array MCA are disconnected from a power generator PG, while the voltages of the word lines WL and the bit lines BL are fixed to VSS (e.g. a ground potential). On the other hand, in the inactive state of the memory cell array MCA, a power supply is applied to at least a part of the main controller MCNT so that it is possible for the memory cell array MCA to be transited from the inactive state to the idle state or active state.

In a case that the command/address receiver RCA is a current-mirror type receiver, the inactive state of the command/address receiver RCA is a state in which the command/address receiver RCA stops a current flowing through the command/address receiver RCA or reduces the current less than a current flowing through the command/address receiver RCA in an active state thereof.

When the command/address receiver RCA is in the active state, the command/address receiver RCA receives inputted signals from external of the memory and takes them in the memory. On the contrary, when the command/address receiver RCA is in the inactive state, the command/address receiver RCA applies a constant signal to the memory regardless of the inputted signals from the external of the memory.

In the MID1 state in which the power generator PG is turned into the active state, a recovery time Tmid1 to the idle state is shorter than Tdpd and longer than Tpd. The power consumption Pmid1 is higher than the power consumption Pdpd and lower than the power consumption Ppd. The third power saving mode means an intermediate state between the first and second power saving modes.

Generally, the volatile memory such as the DRAM performs a refresh operation and a self refresh operation for retaining data stored in the memory cells. The volatile memory does not necessarily perform both the refresh operation and the self refresh operation but often performs only either the refresh operation or the self refresh operation in some cases. The refresh operation is an operation for temporarily reading the data stored in a certain memory cell MC and writing back data having the same logical level to the certain memory cell MC. In the volatile memory such as the DRAM, data is lost (volatilized) unless the refresh operation is periodically performed. That is why the volatile memory periodically performs the refresh operation so as to retain the data. In a normal refresh operation, the volatile memory returns to the idle state after performing the refresh operation on all the word lines (all pages), for example. In the self refresh operation, the refresh operation is automatically and periodically repeated. The volatile memory needs to receive a predetermined command when returning from the self refresh operation to the idle state. For example, the command/address receiver RCA receives the command REF or SREF when the volatile memory starts the refresh operation or the self refresh operation, respectively. When having performed the refresh operation, the volatile memory automatically returns to the idle state. When having performed the self refresh operation, the volatile memory returns from the self refresh operation to the idle state by receiving a command SREFX. In this way, the volatile memory typified by the DRAM requires the refresh operation and the self refresh operation for data retention.

In the self refresh operation for periodically repeating the refresh operation, the command/address receiver RCA is in the inactive state and the power generator PG and the memory cell array MCA are in the active states. Accordingly, power consumption Psref in the self refresh operation is substantially equal to the power consumption Ppd in the PD state. In the self refresh operation, however, the refresh operation is repeatedly performed. Therefore, a recovery time Tsref from the self refresh operation to the idle state is longer than the recovery time Tpd from the PD state to the idle state. That is, the volatile memory has relations of Pdpd<Psref=Ppd<Pidle and Tdpd>Tsref>Tpd.

For example, in a case of a DRAM used in a mobile telephone, the self refresh operation sometimes accounts for 90% or more of a mobile telephone operating time. Furthermore, most of the power consumption of the mobile telephone is that in the self refresh operation. In these circumstances, it is quite important and effective for the volatile memory such as the DRAM to reduce the power consumption in the self refresh operation.

On the other hand, the nonvolatile memory such as the MRAM does not require the refresh operation and the self refresh operation because the MRAM can retain data in a nonvolatile state. Therefore, when the nonvolatile memory such as the MRAM is applied to the standard (for example, LPDDR2) of the volatile memory, the commands REF and SREF for the refresh operation and the self refresh operation are essentially unnecessary.

In the first embodiment, these essentially unnecessary commands REF and SREF are used for the transition of the MRAM to the MID1 state that corresponds to the third power saving mode. As shown in FIG. 5, in the MID1 state, the power generator PG is in the active state and the command/address receiver RCA and the memory cell array MCA are in the inactive states. Therefore, power consumption Pmid1 in the MID1 state is lower than Ppd and Psref and higher than Pdpd. The recovery time Tmid1 from the MID1 state to the idle state is shorter than Tdpd and longer than Tpd. In addition, the recovery time Tmid1 is equal to or shorter than Tsref.

In this way, according to the first embodiment, the MID1 state is equal to or shorter than the self refresh operation in the recovery time and sufficiently lower than the self refresh operation in the power consumption. In the self refresh operation performed by the volatile memory, it is necessary to activate the memory cell array MCA for data retention. In the MID1 state of the nonvolatile memory, by contrast, it is unnecessary to activate the memory cell array MCA because the nonvolatile memory does not perform the refresh operation in the MID1 state.

It is difficult to reduce the power consumption and realize high-speed performance simply by replacing the cell array of the volatile memory with that of the nonvolatile memory. For example, even if the MRAM is simply applied to the JEDEC LPDDR2 standard, the power consumption of the MRAM is little different from that of the DRAM.

However, as shown in FIG. 4, when the command/address receiver RCA of the nonvolatile memory according to the first embodiment receives the refresh command REF or SREF necessary for the volatile memory, the nonvolatile memory according to the first embodiment transitions to the MID1 state. The nonvolatile memory according to the first embodiment can thereby realize both of the low power consumption and the high-speed recovery operation while being applied to the standard of the volatile memory. That is, the nonvolatile memory according to the first embodiment enables the transition to the third power saving mode (the MID1 state) by the use of the refresh command REF or SREF that is essentially unnecessary. The nonvolatile memory according to the first embodiment can thereby ensure the power consumption lower than that of the conventional volatile memory while realizing the high-speed operation.

When the nonvolatile memory or MRAM according to the first embodiment is used in a mobile telephone, the third power saving mode (the MID1 state) accounts for 90% or more of the mobile telephone operating time. Thus, the MRAM is quite advantageous over the volatile memory in that the power consumption Pmid1 in the MID1 state is lower than the power consumption Psref in the self refresh operation performed by the volatile memory.

The clock enable receiver RCKE serving as a second receiver and receiving the clock enable signal CKE and clock signals CK_t and CK_c is kept in the active state (an ON state) in whatever state shown in FIGS. 4 and 5. When the clock enable receiver RCKE receives the clock enable signal CKE, the power controller PC activates the command/address receiver RCA.

Commands for entering the first to third power saving modes are input to the MRAM via the command/address receiver RCA. To exit the first to third power saving modes, the clock enable signal CKE is used irrespective whether the command/address receiver RCA is active or inactive.

Therefore, when the command/address receiver RCA receives a self refresh EXIT command SREFX after the clock enable receiver RCKE receives the clock enable signal CKE, the MRAM can return from the MID1 state to the idle state.

In FIG. 4, MR reading and MR writing indicate a data reading operation and a data writing operation set by a manufacturer or the like of the MRAM, respectively. Resetting is provided for resetting the MRAM when the MRAM returns from the DPD state to the idle state.

Figure 6:
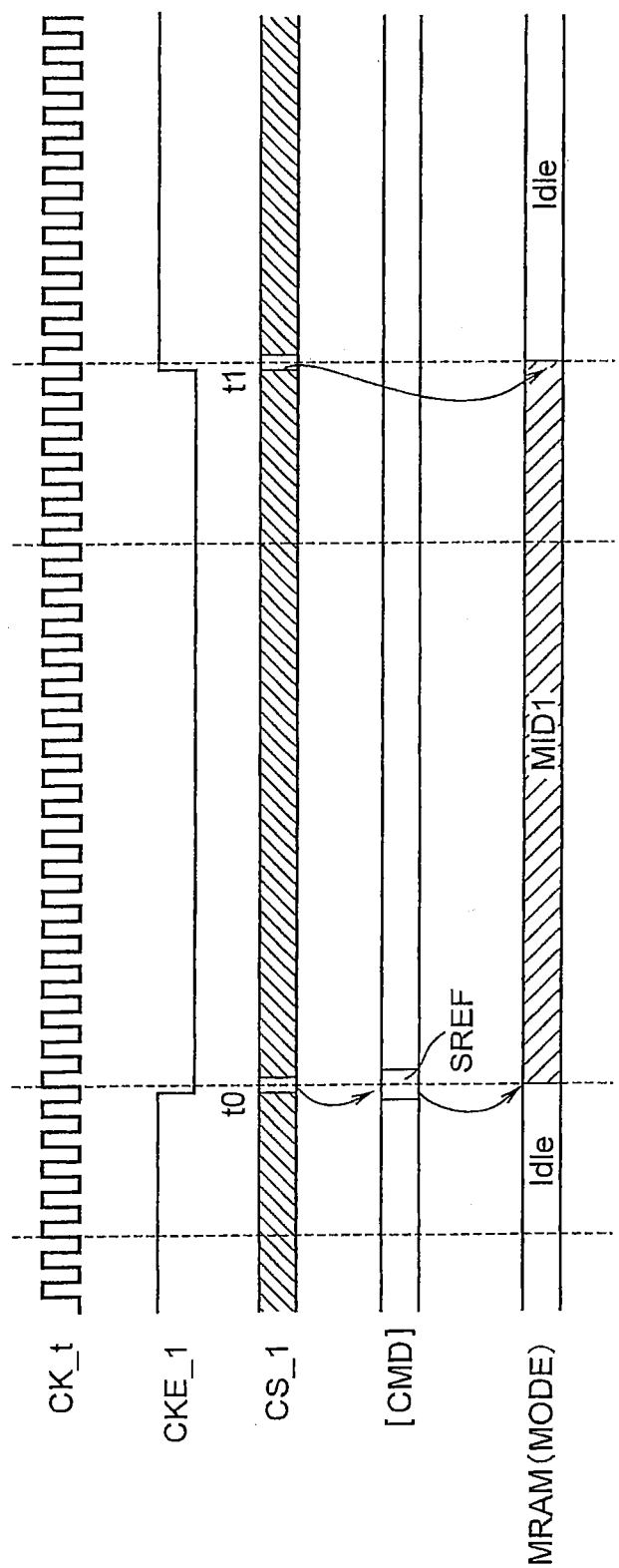
FIG. 6 is a timing diagram showing operations performed by the MRAM according to the first embodiment.

FIG. 6 is a timing diagram showing operations performed by the MRAM according to the first embodiment. At t0, for example, when the clock enable signal CKE_1 is activated to logical low, the clock enable receiver RCKE passes through the clock signals CK_t and CK_c into the MRAM. At this time, when the command/address receiver RCA receives the self refresh command SREF, a memory chip selected according to the chip select signal CS_1 transitions from the idle state to the MID1 state.

At t1, when the clock enable signal CKE_1 is deactivated to logical high, the memory chip selected according to the chip select signal CS_1 returns from the MID1 state to the idle state.

Second Embodiment

Figure 7:
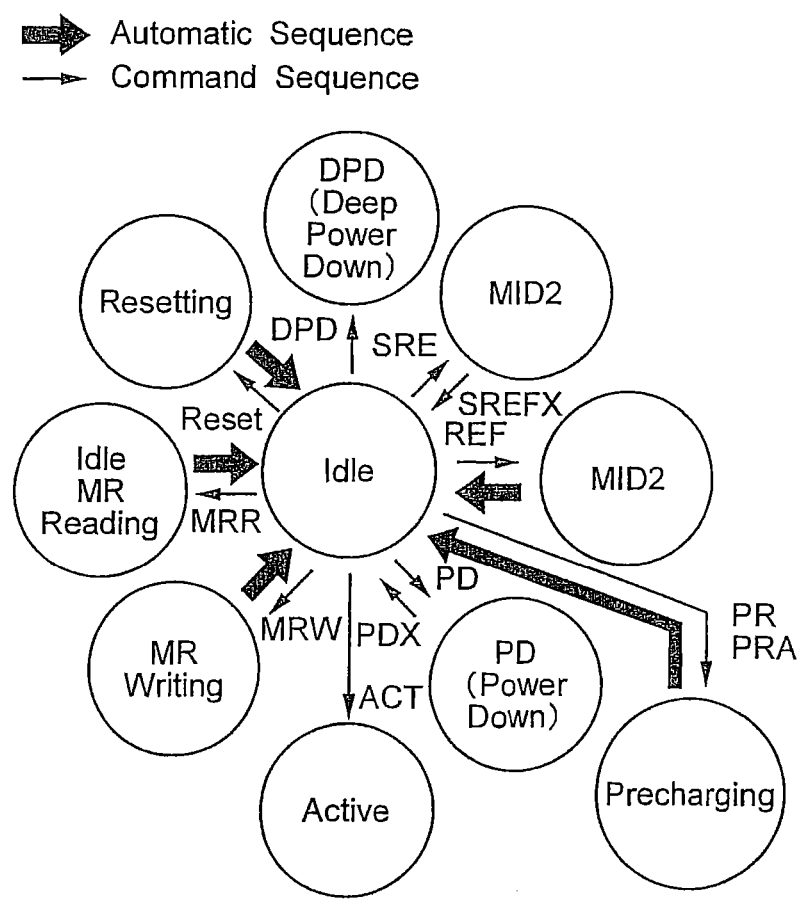
FIG. 7 is a state diagram of an MRAM according to a second embodiment.

FIG. 7 is a state diagram of an MRAM according to a second embodiment. FIG. 8 is a table showing an active state (an ON state) or an inactive state (an OFF state) of each of the command/address receiver RCA, the power generator PG, and the memory cell array MCA in each state of the second embodiment. In FIG. 8, the triangle A indicates that a part of the elements constituting the power generator PG is turned into the inactive state.

In the second embodiment, a second intermediate state (hereinafter, also "MID2 state") instead of the MID1 state corresponds to the third power saving mode. In the MID2 state, the power controller PC turns a part of the elements constituting the power generator PG into the active state and turns the memory cell array MCA and the command/address receiver RCA into the inactive states.

As shown in FIG. 2, the power generator PG includes the Vpp generator GVpp, the Vbb generator GVbb, the band gap reference BGR, and the Vref generator GVref. According to the first embodiment, in the third power saving mode (the MID1. state), the Vpp generator GVpp serving as the first booster, the Vbb generator GVbb serving as the second booster, and the Vref generator GVref serving as the constant-voltage generator are all turned into the inactive states. The Vref generator GVref generates the second voltage Vref based on the first voltage Vbgr generated by the band gap reference BGR. Therefore, when the Vref generator GVref is in the active state, the band gap reference BGR is also activated.

In the second embodiment, at least a part of the elements constituting the Vpp generator GVpp, the Vbb generator GVbb, the band gap reference BGR, and the Vref generator GVref is turned into the inactive state whereas the remaining elements are kept into the active states. Other configuration of the second embodiment can be the same as that of the first embodiment.

For example, 90% of the Vpp generator GVpp can be turned into the inactive state and the remaining 10% thereof can be turned into the active state. Alternatively, ratios of the inactive states to the active states of the Vbb generator GVbb, the band gap reference BGR, and the Vref generator GVref can be independently set. With this configuration, a state can be created, in which state the power consumption is lower than that in the active state, the data reading operation, and the data writing operation, although the susceptibility to noise is more susceptible than that in the active state, the data reading operation, and the data writing operation in which noise increases.

In this way, power consumption Pmid2 in the MID2 state where a part of the elements constituting the power generator PG is turned into the inactive state is higher than the power consumption Pmid1 in the MID1 state described above, but is sufficiently lower than the power consumption Psref in the self refresh operation performed by the volatile memory. A recovery time Tmid2 from the MID2 state to the idle state can be reduced as compared with the recovery time Tmid1 from the MID1 state to the idle state.

Thus, the power consumption Pmid2 and the recovery time Tmid2 can be adjusted depending on which element in the power generator PG is turned into the inactive state in the MID2 state.

In some cases, the power generator PG includes the band gap reference BGR and the Vref generator GVref but does not include the Vpp generator GVpp and the Vbb generator GVbb. In these cases, in the MID2 state, the Vref generator GVref can be turned into the inactive state as a part of the elements constituting the power generator PG. While the band gap reference BGR can be turned into the inactive state, the Vref generator GVref is also turned dormant in such a case.

There are also cases where the power generator PG includes either the Vpp generator GVpp or the Vbb generator GVbb in addition to the band gap reference BGR and the Vref generator GVref. In these cases, in the MID2 state, one of the band gap reference BGR, the Vref generator GVref, and the Vpp generator GVpp can be turned into the inactive state, or one of the bang gap reference BGR, the Vref generator GVref, and the Vbb generator GVbb can be turned into the inactive state as a part of the elements constituting the power generator PG.

In the second embodiment, the recovery time Tmid2 is shorter than Tdpd and longer than Tpd. The power consumption Pmid2 is higher than Pdpd and lower than Ppd. Therefore, the second embodiment can achieve effects identical to those of the first embodiment.

As for operations performed by the MRAM according to the second embodiment, the MID2 state can be used instead of the MID1 state in the operations shown in FIG. 6.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a memory cell array comprising a plurality of nonvolatile memory cells;
a power generator configured to generate a power supply voltage for driving the memory cell array;
a first receiver configured to receive a command and an address for controlling the memory cell array; and
a controller configured to control each of the memory cell array, the power generator, and the first receiver according to the command and the address, wherein
the device has an activation mode of turning the memory cell array, the power generator, and the first receiver into the active states; a first power saving mode of turning the memory cell array, the power generator, and the first receiver into inactive states; a second power saving mode of turning the memory cell array and the power generator into the active states and turning the first receiver into the inactive state; and a third power saving mode of turning at least a part of the power generator into the active state and turning the memory cell array and the first receiver into the inactive states.

2. The device of claim 1, wherein when the first receiver receives a refresh command indicating a refresh operation for retaining data stored in a volatile memory, the device transitions to the third power saving mode.

3. The device of claim 1, further comprising a second receiver configured to receive a clock enable signal for enabling the device to receive a clock signal, wherein
the second receiver is kept in an active state in the first to third power saving modes, and
the device returns from any one of the first to third power saving modes to the activation mode when the second receiver receives the clock enable signal.

4. The device of claim 2, further comprising a second receiver configured to receive a clock enable signal for enabling the device to receive a clock signal, wherein
the second receiver is kept in an active state in the first to third power saving modes, and
the device returns from any one of the first to third power saving modes to the activation mode when the second receiver receives the clock enable signal.

5. The device of claim 1, wherein
the power generator comprises at least a constant-voltage generator configured to generate a first voltage and a reference-voltage generator configured to generate a second voltage used to carry a current to the memory cells based on the first voltage generated by the constant-voltage generator, the first voltage being substantially constant, and
in the third power saving mode, at least one of the constant-voltage generator and the reference-voltage generator is turned into an inactive state.

6. The device of claim 2, wherein
the power generator comprises at least a constant-voltage generator configured to generate a first voltage and a reference-voltage generator configured to generate a second voltage used to carry a current to the memory cells based on the first voltage generated by the constant-voltage generator, the first voltage being substantially constant, and
in the third power saving mode, at least one of the constant-voltage generator and the reference-voltage generator is turned into an inactive state.

7. The device of claim 3, wherein
the power generator comprises at least a constant-voltage generator configured to generate a first voltage and a reference-voltage generator configured to generate a second voltage used to carry a current to the memory cells based on the first voltage generated by the constant-voltage generator, the first voltage being substantially constant, and in the third power saving mode, at least one of the constant-voltage generator and the reference-voltage generator is turned into an inactive state.

8. The device of claim 1, wherein the power generator comprises: a constant-voltage generator configured to generate a first voltage which is substantially constant; a reference-voltage generator configured to generate a second voltage used to carry a current to the memory cells based on the first voltage generated by the constant-voltage generator; and a first booster configured to boost an external voltage toward a positive side or a second booster configured to boost the external voltage toward a negative side, and in the third power saving mode, any part of the constant-voltage generator, the reference-voltage generator, or the first booster is turned into an inactive state, or any part of the constant-voltage generator, the reference-voltage generator, or the second booster is turned into the inactive state.

9. The device of claim 2, wherein the power generator comprises: a constant-voltage generator configured to generate a first voltage which is substantially constant; a reference-voltage generator configured to generate a second voltage used to carry a current to the memory cells based on the first voltage generated by the constant-voltage generator; and a first booster configured to boost an external voltage toward a positive side or a second booster configured to boost the external voltage toward a negative side, and in the third power saving mode, any part of the constant-voltage generator, the reference-voltage generator, or the first booster is turned into an inactive state, or any part of the constant-voltage generator, the reference-voltage generator, or the second booster is turned into the inactive state.

10. The device of claim 3, wherein the power generator comprises: a constant-voltage generator configured to generate a first voltage which is substantially constant; a reference-voltage generator configured to generate a second voltage used to carry a current to the memory cells based on the first voltage generated by the constant-voltage generator; and a first booster configured to boost an external voltage toward a positive side or a second booster configured to boost the external voltage toward a negative side, and in the third power saving mode, any part of the constant-voltage generator, the reference-voltage generator, or the first booster is turned into an inactive state, or any part of the constant-voltage generator, the reference-voltage generator, or the second booster is turned into the inactive state.

11. The device of claim 8, wherein, in the third power saving mode, all of the constant-voltage generator, the reference-voltage generator, and the first booster are turned into the inactive states, or all of the constant-voltage generator, the reference-voltage generator, and the second booster are turned into the inactive states.

12. A method of driving a semiconductor storage device, the semiconductor storage device comprising: a memory cell array comprising a plurality of nonvolatile memory cells; a power generator configured to generate a power supply voltage; and a first receiver configured to receive a plurality of commands and a plurality of addresses for controlling the memory cell array, the semiconductor storage device comprising:
an activation mode of turning the memory cell array, the power generator, and the first receiver into activated modes;
a first power saving mode of turning the memory cell array, the power generator, and the first receiver into inactive states;
a second power saving mode of turning the memory cell array and the power generator into the active states and turning the first receiver into the inactive state; and
a third power saving mode of turning at least a part of the power generator into the active state and turning the memory cell array and the first receiver into the inactive states, the method comprising:
transitioning states of the semiconductor storage device between the activation mode and any one of the first to third power saving modes according to the plurality of commands.

13. The method of claim 12, wherein, when the first receiver receives a refresh command indicating a refresh operation for retaining data stored in a volatile memory, the semiconductor storage device transitions to the third power saving mode.

14. The method of claim 12, wherein the semiconductor storage device further comprises a second receiver configured to receive a clock enable signal for enabling the semiconductor storage device to receive a clock signal, and the second receiver is kept in an active state in the first to third power saving modes, and the semiconductor storage device returns from any one of the first to third power saving modes to the activation mode when the second receiver receives the clock enable signal.

15. The method of claim 13, wherein the semiconductor storage device further comprises a second receiver configured to receive a clock enable signal for enabling the semiconductor storage device to receive a clock signal, and the second receiver is kept in an active state in the first to third power saving modes, and the semiconductor storage device returns from any one of the first to third power saving modes to the activation mode when the second receiver receives the clock enable signal.

16. The method of claim 12, wherein the power generator comprises: a first booster configured to boost an external voltage toward a positive side; a second booster configured to boost the external voltage toward a negative side; a constant-voltage generator configured to generate a first voltage which is substantially constant; and a reference-voltage generator configured to generate a second voltage used to carry a current to the memory cells based on the first voltage generated by the constant-voltage generator, and in the third power saving mode, at least one of the first booster, the second booster, and the constant-voltage generator is turned into an inactive state.

17. The method of claim 13, wherein the power generator comprises: a first booster configured to boost an external voltage toward a positive side; a second booster configured to boost the external voltage toward a negative side; a constant-voltage generator configured to generate a first voltage which is substantially constant; and a reference-voltage generator configured to generate a second voltage used to carry a current to the memory cells based on the first voltage generated by the constant-voltage generator, and in the third power saving mode, at least one of the first booster, the second booster, and the constant-voltage generator is turned into an inactive state.

18. The method of claim 14, wherein the power generator comprises: a first booster configured to boost an external voltage toward a positive side; a second booster configured to boost the external voltage toward a negative side; a constant-voltage generator configured to generate a first voltage which is substantially constant; and a reference-voltage generator configured to generate a second voltage used to carry a current to the memory cells based on the first voltage generated by the constant-voltage generator, and in the third power saving mode, at least one of the first booster, the second booster, and the constant-voltage generator is turned into an inactive state.

19. The method of claim 16, wherein in the third power saving mode, all of the first booster unit, the second booster unit, and the constant-voltage generator are turned into the inactive states.

* * * * *